United States Patent
Fukuda et al.

[11] Patent Number: 5,866,092
[45] Date of Patent: Feb. 2, 1999

[54] GARNET SINGLE CRYSTAL FOR SUBSTRATE OF MAGNETO-OPTIC ELEMENT AND METHOD OF MANUFACTURING THEREOF

[75] Inventors: Tsuguo Fukuda, Sendai; Norio Takeda, Tokyo, both of Japan

[73] Assignee: Mitsubishi Gas Chemical Company, Inc., Tokyo, Japan

[21] Appl. No.: 867,535

[22] Filed: Jun. 2, 1997

[30] Foreign Application Priority Data

Jun. 3, 1996 [JP] Japan .................................. 8-140018

[51] Int. Cl.⁶ .............................. C01F 17/00; C30B 29/28

[52] U.S. Cl. .......................................... 423/263; 117/945

[58] Field of Search ...................... 423/263; 252/521.1; 117/945

[56] References Cited

PUBLICATIONS

Kochurikhin, et al., "The investigation of ions distribution in Czochralski grown...single crystals" Nippon Kessho Seicho Gakkaishi, 23(3), 203, 1996.

*Primary Examiner*—Steven Bos
*Attorney, Agent, or Firm*—Sughrue, Mion, Zinn, Macpeak & Seas, PLLC

[57] ABSTRACT

A garnet crystal for growing a substrate is used for manufacturing a magneto-optic element. The garnet crystal is grown by the Czochralski method and has a chemical structure represented by $Gd_{8-(x+y)}Yb_xGa_yO_{12}$ wherein x has the range $1.0 \leq x \leq 3.0$, y has the range $2.5 \leq y \leq 4.5$, and (x+y) has the range $5.0 \leq (x+y) \leq 6.5$. The method of manufacturing the garnet crystal for growing a magneto-optic element includes the steps of: preparing a mixture of gadolinium oxide, ytterbium oxide, and gallium oxide in a crucible by mixing the oxides together in a weight ratio such that the atomic ratio is Gd:Yb:Ga=3:p:q wherein p has the range $1.0 \leq p \leq 3.0$ and q has the range $2.0 \leq q \leq 4.5$; heating the mixture to make a melt of the mixture; and growing a garnet from the melt of the mixture by the Czochralski method.

3 Claims, No Drawings

GARNET SINGLE CRYSTAL FOR SUBSTRATE OF MAGNETO-OPTIC ELEMENT AND METHOD OF MANUFACTURING THEREOF

BACKGROUND OF THE INVENTION

1. Field of the Invention

The present invention relates to a garnet crystal for growing a bismuth-substituted rare earth iron garnet single crystal film which is used as a magneto-optic element built in optical isolators and optical switches, and more particularly to a garnet crystal substrate which has a large lattice constant and allows solid solution of a large amount of bismuth in a bismuth-substituted rare earth iron garnet single crystal film.

2. Description of the Related Art

A bismuth-substituted rare earth iron garnet single crystal (referred to as BIG) is an excellent material that exhibits good transparency and large Faraday effect in a near-infrared range. Single crystal thick films having a thickness of several hundred microns have been practically used as a Faraday rotator built in optical isolators and optical switches.

A BIG thick film having a thickness of several hundred microns is usually grown on a non-magnetic garnet substrate by a liquid phase epitaxial method. When growing such a thick BIG film, the BIG film and substrate must be very accurately aligned in lattice constant. A large difference in lattice constant results in defects in crystal structure or cracks in the substrate due to stress.

A garnet substrate for growing a BIG thick film includes an SGGG substrate made of $(CaGd)3(MgZrGa)_5O_{12}$ having a lattice constant of 1.2497 nm and an NGG substrate made of $Nd_3Ga_5O_{12}$ having a lattice constant of 1.2509 nm. The Faraday effect and lattice constant, of a BIG film increase with increasing amount of bismuth-substitution and there have been demands towards a garnet substrate having an even larger lattice constant. An article in "Journal of Solid State Chemistry VOL. 5(1972), P. 85ff." has reported on a garnet crystal having a large lattice constant. The article reports that garnet phase was observed when a mixture of rare-earth oxide and gallium oxide reacted in solid phase.

In order to manufacture a substrate for growing a bismuth-substituted rare earth iron garnet single crystal film, a single crystal is required which has a diameter greater than one inch without cracks. However, there has been no report on such a single crystal yet.

SUMMARY OF THE INVENTION

An object of the invention is to provide a garnet crystal for growing a BIG thick film having a large lattice constant.

A garnet crystal for growing a substrate used for a magneto-optic element of the invention is manufactured by a Czochralski method and having a chemical structure represented by: $Gd_{8-(x+y)}Yb_xGa_yO_{12}$ wherein x has the range $1.0 \leq x \leq 3.0$, y has the range $2.5 \leq y \leq 4.5$, and (x+y) has the range $5.0 \leq (x+y) \leq 6.5$.

It is preferable that x has the range $1.4 \leq x \leq 2.2$, y has the range $3.3 \leq y \leq 4.0$, and (x+y) has the range $5.3 \leq (x+y) \leq 5.7$.

A method of manufacturing a garnet crystal for growing a magneto-optic element includes the steps of:

preparing a mixture of gadolinium oxide, ytterbium oxide, and gallium oxide in a crucible by mixing the oxides together in a weight ratio such that the atomic ratio is Gd:Yb:Ga=3:p:q wherein p has the range $1.0 \leq p \leq 3.0$ and q has the range $2.0 \leq q \leq 4.5$;

heating the mixture to make a melt, of the mixture in the crucible; and growing a garnet from the melt of the mixture by the Czochralski method.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

The inventors have put significant efforts in developing a garnet crystal for growing a BIG thick film having a large lattice constant, and arrived at the present invention.

The present invention relates to a garnet crystal for growing a magneto-optic element manufactured by the Czochralski method and represented by a chemical formula;

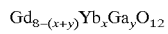

$$Gd_{8-(x+y)}Yb_xGa_yO_{12}$$

wherein x has the rage $1.0 \leq x \leq 3.0$, $2.5 \leq y \leq 4.5$, and $5.0 \leq (x+y) \leq 6.5$, and more preferably $1.4 \leq x \leq 2.2$, $3.3 \leq y \leq 4.0$, and $5.3 \leq (x+y) \leq 5.7$.

Gadolinium oxide, ytterbium oxide, gallium oxide are sufficiently mixed together in a weight ratio in a crucible such that the atomic ratio is Gd:Yb:Ga=3:p:q wherein p has the range $1.0 \leq p \leq 3.0$ and $2.0 \leq q \leq 4.7$, and preferably $1.4 \leq p \leq 2.2$ and $2.5 \leq q \leq 3.7$. Then, a garnet, crystal for growing a substrate is grown from the melt using the Czochralski method. The garnet crystal is produced in an inert gas atmosphere containing oxygen in the range of preferably from 1% to 5% by volume.

In the present invention, the crucible in which the mixture of the oxides is melted is preferably made of iridium.

A garnet crystal for growing a substrate for a magneto-optic element, according to the present invention, is grown by the liquid phase epitaxial method and is conveniently used as a substrate for growing a bismuth-substituted rare earth iron garnet single crystal represented by a general formula: $R_{3-z}Bi_zFe_{5-w}M_wO_{12}$ wherein z has the range $0 \leq z \leq 2.0$ and $0 \leq w \leq 2.0$ and R denotes at least one element selected from the group consisting of Y, la, Ce, Pr, Nd, Sm, Eu, Gd, Tb, Dy, Ho, Er, Tm, Yb, and Lu, and M is at least one of In, Sc, Ga, and Al.

Embodiments

The present invention will be described by way of example. Examples 1 and 2 are only exemplary and the present invention is not limited to these examples.

Example 1

A 200 gm mixture of gadolinium oxide ($Gd_2O_3$), ytterbium oxide ($Yb_2O_3$), gallium oxide ($Ga_2O_3$), all being of a purity of 99.99%, was introduced into an iridium crucible having a diameter of 38 mm and a height of 38 mm. The weight ratio of the oxides was such that atomic ratio was Gd:Yb:Ga=3.0:2.0:3.0. Then, a crystal was grown by the Czochralski method in an argon atmosphere containing oxygen of 1.5% by volume. The seed crystal was rotated at a rotational speed of 10 r.p.m. and lifted at a speed of 1.3 mm/hr. The seed crystal was used which is represented by (111) $Gd_3Ga_5O_{12}$. The thus obtained crystal was examined by X-ray diffraction and elementary analysis and found to be a garnet crystal having a crystal composition of $Gd_{2.52}Yb_{1.90}Ga_{3.58}O_{12}$ and a lattice constant of 1.2642 nm.

Example 2

A crystal was grown in the same way as Example 1 except that a 200 gm mixture of gadolinium oxide ($Gd_2O_3$), ytterbium oxide ($Yb_2O_3$), gallium oxide ($Ga_2O_3$) was introduced into an iridium crucible having a diameter of 38 mm and a height of 38 mm, the oxides being of a 99.99% purity and in weight ratio such that atomic ratio is Gd:Yb:Ga= 3.0:1.5:3.5.

The thus obtained crystal was examined by X-ray diffraction and elementary analysis and found to be a garnet crystal having a crystal composition of $Gd_{2.5}Yb_{1.52}Ga_{3.97}O_{12}$ and a lattice constant of 1.257 nm.

As mentioned above, the present invention provides a garnet substrate having a larger lattice constant than conventional garnet substrate, and allows more amount of bismuth substitution in a bismuth substituted rare earth iron garnet single crystal manufactured by the liquid phase epitaxial method. As a result, a Faraday rotator having large magneto-optic effect can be obtained which is used in magneto-optic devices such as optical isolators, optical switches and magneto-optic sensors.

The invention being thus described, it will be obvious that the same may be varied in many ways. Such variations are riot to be regarded as a departure from the spirit and scope of the invention, and all such modifications as would be obvious to one skilled in the art are intended to be included within the scope of the following claims.

What is claimed is:

1. A garnet crystal for growing a substrate used in manufacturing a magneto-optic element, the garnet crystal being manufactured by a Czochralski method and having a chemical formula represented by:

$$Gd_{8-(x+y)}Yb_xGa_yO_{12}$$

wherein x has the range $1.0 \leq x \leq 3.0$, y has the range $2.5 \leq y \leq 4.5$, and (x+y) has the range $5.0 \leq (x+y) \leq 6.5$.

2. The garnet crystal according to claim 1, wherein x has the range $1.4 \leq x \leq 2.2$, y has the range $3.3 \leq y \leq 4.0$, and (x+y) has the range $5.3 \leq (x+y) \leq 5.7$.

3. The garnet crystal according to claim 1, wherein said is magneto-optic element is grown on said crystal by an LPE method, said magneto-optic element being represented by a chemical formula, $$R_{3-z}Bi_zFe_{5-w}M_wO_{12}$$

where in z has the range $0 \leq z \leq 2.0$ and w has the range $0 \leq w \leq 2.0$ R is at least one element selected from the group consisting of Y, La, Ce, Pr, Nd, Sm, Eu, Gd, Tb, Dy, Ho, Er, Tm, Yb, and Lu, and M is at least one element selected from the group consisting of In, Sc, Ga, and Al.

* * * * *